United States Patent
Wang et al.

(10) Patent No.: US 9,136,118 B2
(45) Date of Patent: Sep. 15, 2015

(54) IRIDIUM-DOPED CARBON NANOTUBE AND ELECTRODE AND SENSOR CONTAINING THE SAME

(71) Applicant: I Shou University, Kaohsiung (TW)

(72) Inventors: Shih-Han Wang, Kaohsiung (TW); Ming-Tsai Liang, Kaohsiung (TW); Ping-Chao Huang, Kaohsiung (TW); Chien-Ching Yu, Kaohsiung (TW); Kuan-Jung Chen, Kaohsiung (TW)

(73) Assignee: I Shou University, Kaohsiung (TW)

( * ) Notice: Subject to any disclaimer, the term of this patent is extended or adjusted under 35 U.S.C. 154(b) by 0 days.

(21) Appl. No.: 14/180,389

(22) Filed: Feb. 14, 2014

(65) Prior Publication Data
US 2015/0233860 A1    Aug. 20, 2015

(51) Int. Cl.
*H01L 29/06*    (2006.01)
*H01L 21/02*    (2006.01)

(52) U.S. Cl.
CPC ................ *H01L 21/02606* (2013.01)

(58) Field of Classification Search
CPC ............ H01L 21/02606; H01L 29/0669; H01L 29/413; H01L 51/0045; H01L 51/0048
USPC ............ 257/E51.04, E51.038; 977/700, 742, 977/842, 938
See application file for complete search history.

(56) References Cited

U.S. PATENT DOCUMENTS

2010/0234477 A1*    9/2010    Bao et al. .............. 518/716

* cited by examiner

*Primary Examiner* — Tan N Tran
(74) *Attorney, Agent, or Firm* — Cesari and McKenna, LLP

(57) ABSTRACT

An iridium-doped carbon nanotube has an atomic ratio of iridium to carbon on a surface thereof ranging from $1\times10^{-4}$ to $3.5\times10^{-4}$ as measured by X-ray photoelectron spectroscopy. A working electrode including the aforesaid iridium-doped carbon nanotube and a sensor including the working electrode are also disclosed in the present invention.

6 Claims, 1 Drawing Sheet

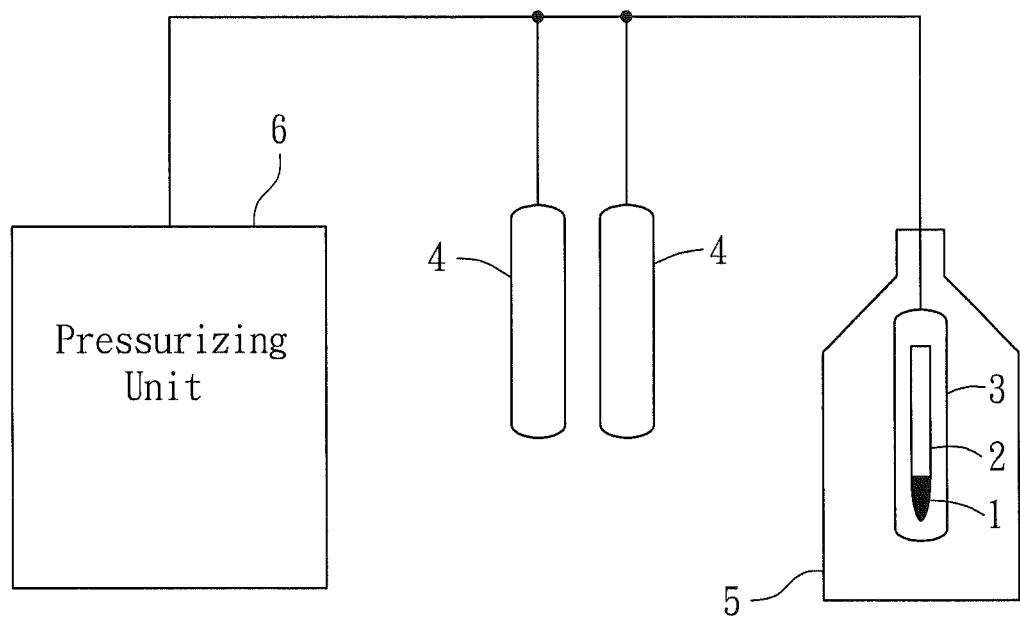

IRIDIUM-DOPED CARBON NANOTUBE AND ELECTRODE AND SENSOR CONTAINING THE SAME

BACKGROUND OF THE INVENTION

1. Field of the Invention

This invention relates to a carbon nanotube, more particularly to an iridium-doped carbon nanotube and an electrode and a sensor including the iridium doped carbon nanotube.

2. Description of the Related Art

Carbon nanotubes (CNTs) have been widely adopted into a variety of composite materials, transistors, or sensors because of their physical properties such as light weight, superior corrosion resistance, high hardness, high melting points, as well as high electrical conductivity. For instance, Taiwanese Patent No. I276799 discloses a biosensor including an electrode which has a modified carbon nanotubes layer thereon for enhancing the sensitivity of detecting specific biological molecules.

In *Anal. Chem.*, 2003, 75, 2075-2079, J. Wang et al. disclose an electrochemical sensor including a carbon nanotubes/Teflon composite material, which can be further modified to be a biosensor by immobilizing enzymes on a sensing area of the electrochemical sensor. However, the aforesaid carbon nanotube/Teflon composite biosensor lacks a metal dopant and thus has inferior sensitivity. L. Fang et al. disclose an electrochemical biosensor for detecting β-nicotinamide adenine dinucleotide (NADH) in *Sens. Actuators B*, 2008, 129, 818-825, including a modified carbon/iridium working electrode that is doped with 5% of iridium particles to enhance the sensitivity of the electrochemical biosensor. However, high amounts of metal particles doped in the working electrode result in a lower signal-to-noise ratio so that the selectivity of the working electrode is not sufficiently high.

Therefore, there is a need in the art to provide a composite material to modify an electrode for having high sensitivity and yet maintaining sufficiently high selectivity.

SUMMARY OF THE INVENTION

Therefore, one object of the present invention is to provide a carbon nanotube that is doped slightly with iridium and able to enhance the sensitivity of an electrode without sacrificing the selectivity thereof when the carbon nanotube is applied on the electrode. Another object of the present invention is to provide an electrode including the aforesaid carbon nanotube. Yet another object of the present invention is to provide a sensor including the aforesaid carbon nanotube.

According to a first aspect, an iridium-doped carbon nanotube of this invention has an atomic ratio of iridium to carbon on a surface thereof ranging from $1 \times 10^{-4}$ to $3.5 \times 10^{-4}$ as measured by X-ray photoelectron spectroscopy.

According to a second aspect, an electrode including the iridium-doped carbon nanotube is disclosed in the present invention.

According to a third aspect, a sensor of this invention includes:

an insulated substrate;

a working electrode formed on the insulated substrate and including the aforesaid iridium-doped carbon nanotube;

a reference electrode formed on the insulated substrate and spaced apart from the working electrode; and a counter electrode formed on the insulated substrate and spaced apart from the working electrode and the reference electrode.

BRIEF DESCRIPTION OF THE DRAWING

Other features and advantages of the present invention will become apparent in the following detailed description of the preferred embodiment of this invention, with reference to the accompanying drawing, in which:

FIG. 1 is a schematic diagram of a supercritical fluid deposition system for producing iridium-doped carbon nanotubes of Examples 1 and 2, and Comparative Examples 1 and 2.

DETAILED DESCRIPTION OF THE PREFERRED EMBODIMENT

According to the present invention, an iridium-doped carbon nanotube (CNT) is provided with an atomic ratio of iridium to carbon on a surface thereof ranging from $1 \times 10^{-4}$ to $3.5 \times 10^{-4}$, as measured by X-ray photoelectron spectroscopy. The iridium-doped carbon nanotube may be a single-walled carbon nanotube or a multi-walled carbon nanotube. Preferably, the iridium-doped carbon nanotube is a multi-walled carbon nanotube.

The iridium-doped carbon nanotube of this invention can be made by the following steps:

(a) placing carbon nanotubes and an aqueous solution containing iridium(III) ions as a precursor into a supercritical fluid deposition system, wherein the carbon nanotubes and the aqueous solution are separated from each other; and (b) heating and pressurizing the carbon nanotubes and the aqueous solution in the supercritical fluid deposition system to achieve a supercritical state, so as to deposit iridium nanoparticles on the carbon nanotubes and to obtain the iridium-doped carbon nanotubes.

An electrode is provided in the present invention and includes the aforesaid iridium-doped carbon nanotube. Preferably, the electrode has a detection sensitivity of NADH ranging from $19.28 \times 10^{-5}$ A/mM·cm$^2$ to $37.82 \times 10^{-5}$ A/mM·cm$^2$.

A sensor is further provided in the present invention and includes an insulated substrate, a working electrode formed on the insulated substrate and including the iridium-doped carbon nanotube of this invention, a reference electrode formed on the insulated substrate and separated from the working electrode, and a counter electrode formed on the insulated substrate and separated from the working electrode and the reference electrode.

Preferably, the sensor further includes a redox enzyme for detecting a target. More preferably, the redox enzyme is L-lactate dehydrogenase (LDH), where LDH is a catalyst for NADH oxidation reaction.

EXAMPLES

Example 1 (Ex 1)

Preparation of Iridium-Doped CNTs

As shown in FIG. 1, a supercritical fluid deposition system was used for manufacturing iridium-doped CNTs and includes a ⅜ inch stainless steel tube 3, two buffer tanks 4, a heating furnace 5, a gas pressurizing unit 6, a plurality of pipes in fluid communication with the pressurizing unit 6, the buffer tanks 4, and the stainless steel tube 3, and a plurality of valves provided among the pipes. The gas pressurizing unit 6 includes a carbon dioxide gas tank, coolers, and a pump. Iridium-doped carbon nanotubes of Example 1 were prepared via the supercritical fluid deposition system by the following steps:

(a) adding 8 mg of multi-walled carbon nanotubes 1, which had been processed with a hydrophilic treatment in advance via nitric acid, and 100 μL of 12 mM $IrCl_3$ aqueous solution into a glass tube 2 with 3 mm of an inner diameter and 15 mm of length, wherein the carbon nanotubes and the $IrCl_3$ aqueous solution were separated from each other via a glass wool layer;

(b) disposing the glass tube 2 into the stainless steel tube 3 which connects with the gas pressurizing unit 6 and which was fixed in the heating furnace 5;

(c) raising the pressure in the stainless steel tube 3 to 250 bar via the gas pressurizing unit 6;

(d) raising the temperature of the stainless steel tube 3 to 400° C. for 90 minutes via the heating furnace 5 when the pressure reached a steady state; and (e) extracting the carbon nanotubes from the glass tube 2, followed by washing and drying the carbon nanotubes to obtain the iridium-doped carbon nanotubes of Example 1.

<Preparation of Electrode Containing CNTs>

The electrode containing the iridium-doped CNTs of Example 1 was produced from a method including the following steps:

(a) mixing 0.136 ml of 50%(w/v) polyethyleneimine (1,300 of average molecular weight, commercially available from Sigma-Aldrich Co.), hydroxyethyl cellulose (commercially available from Sigma-Aldrich Co.), and 1 ml of 10 mM phosphate buffer solution (PBS) together and agitating for four hours to obtain a gel mixture;

(b) adding 90 mg of the aforesaid iridium-doped carbon nanotubes into the gel mixture, followed by sonicating for one hour and agitating via a magnetic stir bar for another eight hours, and waiting until bubbles in the gel mixture disappeared so as to obtain a resultant gel product; and (c) distributing the resultant gel product on a sensing area (5 $mm^2$) of an electrode evenly, followed by drying for an hour and baking at 130° C. for 3 hours to obtain a working electrode containing the aforesaid iridium-doped carbon nanotubes.

An electrode set including the resultant working electrode was obtained by disposing the working electrode, a carbon paste electrode as a counter electrode, and a silver/silver chloride reference electrode separately onto an insulated substrate, and applying a silicone layer on the electrodes and the insulated substrate such that a partial region of each of the electrodes, which was used as a sensing area, was exposed from the silicone layer.

<Preparation of NADH Sensor>

A method for making a NADH sensor using the aforesaid electrode set includes the following steps:

(a) mixing 0.25 μL of 18% (w/v) glutaraldehyde solution, 0.25 μL of 12% (w/v) bovine serum albumin (BSA) solution, and 1 μL of 4000 U/mL L-lactate dehydrogenase (LDH, commercially available from Sigma-Aldrich Co.) evenly to form an enzyme solution;

(b) distributing 1.5 μL of the enzyme solution onto the sensing area of the working electrode and drying for an hour; and (c) cooling the electrode set at 4° C. for eight hours to obtain a NADH sensor.

Example 2 (Ex 2)

The method for preparing the iridium-doped carbon nanotubes of Example 2 is similar to that of example 1. The only difference resides in that, in step (d), the temperature of the stainless steel tube 3 was raised to 300° C. instead of 400° C.

The iridium-doped CNTs of example 2 were used to produce an electrode, and an electrode set and a NADH sensor using the procedures the same as those of Example 1.

Comparative Example 1 (CE 1)

The method for preparing the iridium-doped carbon nanotubes of Comparative Example 1 is similar to that of example 1. The only difference resides in that, in step (a), the multi-walled carbon nanotubes and the $IrCl_3$ aqueous solution were mixed evenly before placing in the glass tube 2, and thus a glass wool layer was dispensed from Comparative Example 1.

The iridium-doped CNTs of Comparative Example 1 were used to produce an electrode, and an electrode set and a NADH sensor using the procedures the same as those of Example 1.

Comparative Example 2 (CE 2)

The method for preparing the iridium-doped carbon nanotubes of Comparative Example 2 is similar to that of Comparative Example 1. The only difference resides in that in step (d) the temperature of the stainless steel tube 3 was raised to 300° C. instead of 400° C.

The iridium-doped CNTs of Comparative Example 2 were used to produce an electrode, and an electrode set and a NADH sensor using the procedures the same as those of Example 1.

[Measurements]

[Measurement of Iridium Content of CNTs]

The iridium content of the iridium-doped carbon nanotubes of Example 1 was measured by X-ray absorption spectroscopy (Beam Line BL17C1, National Synchrotron Radiation Research Center, Taiwan) with the following operating conditions:

(1) 1.5 GeV and 300 mA of an electron beam intensity for generating x-ray;

(2) a set of Si(111) single crystal monochromators to adjust the scan resolution (ΔE/E) larger than $1 \times 10^{-4}$ before or after Iridium $L_{III}$ edge (11215 eV); and (3) the iridium-doped carbon nanotubes were reduced in 10% hydrogen gas for 30 minutes in advance.

The iridium content of the iridium-doped CNTs of the present invention thus measured was 0.0053 wt % based on total weight of the iridium-doped CNTs, and the iridium amount of the iridium-doped CNTs of Example 1 was considerably low.

[Measurement of Surface Atomic Ratio of CNTs]

The atomic ratio of iridium to carbon of the iridium-doped carbon nanotubes of Examples 1 and 2, and Comparative Examples 1 and 2 were measured by X-ray photoelectron spectroscopy (manufactured by ULVAC-PHI Inc.). The atomic ratio was obtained by comparing photoelectron signals of iridium (4f) and carbon (1s) for each of Examples 1 and 2, and Comparative Examples 1 and 2. Results are listed in Table 1.

[Measurement of Heterogeneous Charge Transfer Rate Constant]

The electrode set of each of Examples 1 and 2, and Comparative Examples 1 and 2 was connected electrically to an electrochemical analyzer (Model CHI 614B, commercially available from CH Instruments Inc.) and was placed into a solution containing 15 mM $K_3FeCN_6/K_4FeCN_6$ and 15 mM KCl. The temperature of the solution was at 37° C. Cyclic Voltammetry (CV) was then applied to each of the electrode sets with an applied voltage ranging from −0.4 V to +0.4 V.

Based on the Nicholson equation, the heterogeneous charge transfer rate constant ($k°$) of the electrode set was calculated by altering the voltage scan rate (from 3 to 100 mV/see). The value of the heterogeneous charge transfer rate constant for each of the electrode sets according to Examples 1 and 2, and Comparative Examples 1 and 2 is listed in Table 1.

[Detection of NADH]

Each of the NADH sensors of Examples 1 and 2, and Comparative Examples 1 and 2 was dipped into a NADH solution at 37° C. with different concentrations in order to measure the sensitivity of the NADH sensors. Each of the NADH sensors was electrically connected to an electrochemical analyzer (Model CHI 614B, commercially available from CH Instruments Inc.) and a constant voltage of 0.18V was then applied to the NADH sensor for 200 seconds so as to measure a resultant current and to calculate the current density under different NADH concentrations (50 μM, 100 μM, and 200 μM). The results of current density of each of the NADH sensors were plotted with respect to NADH concentration, followed by calculating the slope so as to obtain the sensitivity of each of the NADH sensors. Results of Examples 1 and 2, and Comparative Examples 1 and 2 are shown in Table 1.

[Detection of NADH Under Interference of Ascorbic Acid]

Each of the sensors according to Examples 1 and 2, and Comparative Examples 1 and 2 was electrically connected to the electrochemical analyzer and dipped into a PBS solution containing NADH with a predetermined concentration at 37° C., followed by applying 0.18V of constant voltage to the sensor and measuring the value of the current signal when the current signal reaches a steady state. After 600 seconds at the steady state, a PBS solution containing ascorbic acid was instantly added into the NADH containing PBS solution (the concentration of the ascorbic acid was 0.6 mg/dL after the PBS solution containing ascorbic acid was added into the NADH containing PBS solution) and a resultant current signal was measured to determine the variation thereof. Comparisons between the resultant current signals of Examples 1 and 2, and Comparative Examples 1 and 2 show that the sensors of Examples 1 and 2 have smaller fluctuation of the NADH signals than that of Comparative Examples 1 and 2 under interference of ascorbic acid.

TABLE 1

|  | Surface Iridium/Carbon atomic ratio | Heterogeneous charge transfer rate constant ($k^0$) (cm/sec) | NADH Sensitivity (A/mM · cm$^2$) |
| --- | --- | --- | --- |
| Ex 1 | $3.2 \times 10^{-4}$ | $2.49 \times 10^{-3}$ | $37.82 \times 10^{-5}$ |
| Ex 2 | $1.05 \times 10^{-4}$ | $1.07 \times 10^{-3}$ | $19.28 \times 10^{-5}$ |
| CE 1 | $14.09 \times 10^{-4}$ | $0.18 \times 10^{-3}$ | $7.49 \times 10^{-5}$ |
| CE 2 | $12.66 \times 10^{-4}$ | $0.21 \times 10^{-3}$ | $12.46 \times 10^{-5}$ |

The iridium-doped CNTs of Examples 1 and 2 have lower Surface atomic ratio of iridium to carbon than those of Comparative Examples 1 and 2, showing that the iridium-doped CNTs of Examples contain less amounts of iridium than those of the Comparative Examples. The working electrodes of Examples 1 and 2 have higher heterogeneous charge transfer rate constant than those of the working electrodes of Comparative Examples 1 and 2, showing that the working electrodes of Examples 1 and 2 respond faster than the working electrodes of Comparative Examples 1 and 2. The sensors of Examples 1 and 2 have higher sensitivity than those of Comparative Examples 1 and 2. Also, from the fluctuation of the resultant current signals of the NADH detection under the interference of ascorbic acid, the sensors of Examples 1 and 2 have better selectivity of NADH with respect to ascorbic acid than those of Comparative Examples 1 and 2.

To sum up, the iridium-doped CNTs of the present invention contain significantly low iridium amounts and have better heterogeneous charge transfer effect. Besides, the working electrodes and the sensors according to the present invention have relatively high sensitivity and selectivity.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. An iridium-doped carbon nanotube, having an atomic ratio of iridium to carbon on a surface thereof ranging from $1 \times 10^{-4}$ to $3.5 \times 10^{-4}$.

2. The iridium-doped carbon nanotube according to claim 1, wherein the atomic ratio of iridium to carbon is measured by X-ray photoelectron spectroscopy.

3. The iridium-doped carbon nanotube according to claim 1, wherein said iridium-doped carbon nanotube is multi-walled.

4. An electrode made from the iridium-doped carbon nanotube of claim 1.

5. The electrode according to claim 4, having a detection sensitivity of NADH ranging from $19.28 \times 10^{-5}$ A/mM·cm$^2$ to $37.82 \times 10^{-5}$ A/mM·cm$^2$.

6. A sensor comprising:
an insulated substrate;
a working electrode formed on said insulated substrate and including the iridium-doped carbon nanotube of claim 1;
a reference electrode formed on said insulated substrate and spaced apart from said working electrode; and
a counter electrode formed on said insulated substrate and spaced apart from said working electrode and said reference electrode.

* * * * *